United States Patent [19]

Pedersen

[11] Patent Number: 5,572,717
[45] Date of Patent: Nov. 5, 1996

[54] METHOD AND APPARATUS FOR ASSIGNING AND ANALYZING TIMING SPECIFICATIONS IN A COMPUTER AIDED ENGINEERING PROGRAM

[75] Inventor: Bruce Pedersen, San Jose, Calif.

[73] Assignee: Altera Corporation, San Jose, Calif.

[21] Appl. No.: 223,914

[22] Filed: Apr. 6, 1994

[51] Int. Cl.$^6$ ............................................. G06F 15/60
[52] U.S. Cl. .......................... 395/555; 364/490; 364/491; 364/488; 364/489
[58] Field of Search .......................... 395/550; 364/490, 364/491

[56] References Cited

U.S. PATENT DOCUMENTS

| | | | |
|---|---|---|---|
| 4,608,669 | 8/1986 | Klora et al. | 365/201 |
| 4,703,435 | 10/1987 | Darringer et al. | 364/489 |
| 5,113,352 | 5/1992 | Finnerty | 364/490 |
| 5,197,015 | 3/1993 | Hartoog et al. | 364/490 |
| 5,218,551 | 6/1993 | Agrawal et al. | 364/491 |
| 5,251,147 | 10/1993 | Finnerty | 364/490 |

Primary Examiner—Kevin A. Kriess
Assistant Examiner—Majid A. Banankhah
Attorney, Agent, or Firm—Townsend and Townsend and Crew LLP

[57] ABSTRACT

A system for allowing a user to assign timing specifications to points in a circuit and have the timing properties of the circuit analyzed with respect to the timing specifications. The system allows timing specifications such as maximum propagation delay, clock-to-output delay, setup time and maximum clock frequency to be assigned at any point in the circuit. The system uses predefined rules to determine which of multiple possible specifications are to be used in analyzing each path of the circuit. A method of concurrently performing the assignment and analysis is described.

9 Claims, 6 Drawing Sheets

METHOD AND APPARATUS FOR ASSIGNING AND ANALYZING TIMING SPECIFICATIONS IN A COMPUTER AIDED ENGINEERING PROGRAM

BACKGROUND OF THE INVENTION

This invention relates generally to computer aided engineering programs and specifically to a method and apparatus for assigning and analyzing timing specifications in a computer aided engineering program.

Much of the process of creating, testing and implementing an electronic circuit has been automated by the use of computers as a design tool. The computer executes a design or engineering program that provides a human user with tools such as "capturing" a design into electronic form, editing the design with the computer, detecting errors in the design, simulating the operation of the design and translating the design into a component layout or integrated circuit mask pattern depending on the final implementation. The availability of efficient, user-friendly software tools to aid the designer has become very important as the size and complexity of circuits designs increases.

One function provided by computer aided design tools is automatic synthesis and optimization of a circuit design from a schematic diagram. The computer aided design (CAD) system is given a set of constraints, such as timing specifications, and produces a circuit that performs the logic of the schematic diagram while meeting the specified constraints. A typical constraint is, e.g., minimum propagation delay from an input to an output. The CAD system may have to improve the speed of portions of the design by implementing logic functions in combinatorial logic as opposed to standard cells, by using faster logic families or by reducing the number of components used to achieve time critical logic functions.

The synthesis and optimization of a design from a schematic diagram can be complex and time consuming both to the human designer and to the computer's resources where the circuit of the schematic diagram is large and the constraints are many and stringent. Further, requiring the designer to specify constraints to the computer program in the first place can be very burdensome and time consuming. The designer must evaluate many factors including signal relationships, manufacturing costs, the timing of external signals that the circuit must interface with, tolerances of components used in the circuit, etc.

Methods used in the past allow a designer to place constraints on the optimization and synthesis of logic from a schematic diagram by using a "delay matrix." The delay matrix approach consists of entering an N by N array of numbers specifying the minimum required delay from any input to any output in the circuit being designed. This has the disadvantage of requiring a large number of entries (up to $N^2$) by the designer, or user, of the system. It is often difficult or impossible for the designer to annotate this information on an element by element basis in the source schematic even when the schematic is an electronic copy since so many numbers are required by each element. By only allowing constraints for the input and outputs, the traditional method tries to define the timing requirements of a circuit in a very limited way by specifying a single arrival time for every input and the minimum time for each output to become stable. Also, this does not take into account ambiguities that arise when synchronous logic elements, such as flip flops, are used in the circuit design.

SUMMARY OF THE INVENTION

The present invention allows the user to enter design constraints in the form of timing specifications. The timing specifications are of the type typically encountered in data sheets for electronic devices and with which the user is familiar. The invention allows a user to specify the timing specifications at different points in an internal logic path of the circuit even when multiple paths begin or end at common input and output (I/O) pins. The invention provides a system for assigning and analyzing the timing specifications so that a set of timing constraints is derived from the specifications that can be easily interpreted by the logic optimizing portion of CAD tools. A system for determining whether timing properties of a circuit meet the timing specifications is presented.

A preferred embodiment allows the user to enter timing specifications in terms of $t_{pd}$ (combinatorial propagation delay), $t_{co}$ (clock to output delay), $t_{su}$ (setup time) and $f_{max}$ (maximum clock frequency).

The system of the present invention operates on a logic design that includes inputs, outputs and a plurality of logic elements coupled together to form at least one path from an input to one or more outputs via the logic elements. The system uses a computer executing software. A user of the system defines a timing specification and associates it with a first node in one of the paths of the logic design. The system identifies one or more paths that pass through the node. That is, paths can overlap portions of each other and, thus, share a node. The system identifies paths that originate at an input, passed through the first node and terminate at an output. A timing property corresponding to the timing specification is determined from predetermined data about the path or paths passing through the node. The timing property of each path that passes through the node is compared to the timing specification and the user is given output information that indicates the relationship of each path's timing property to the timing specification.

DETAILED DESCRIPTION OF A PREFERRED EMBODIMENT

Figure 1:
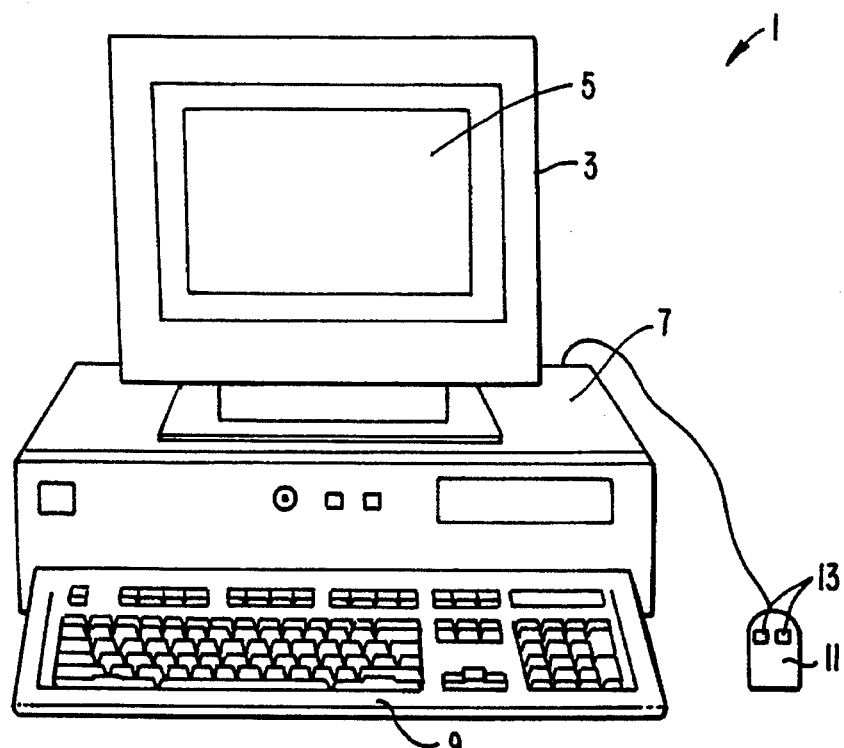
FIG. 1 is an illustration of a computer system suitable for use with the present invention.

FIG. 1 is an illustration of a computer system suitable for executing the software of the present invention. FIG. 1 depicts but one example of many possible computer types or configurations capable of being used with the present invention. FIG. 1 shows computer system 1 including display device 3, display screen 5, cabinet 7, keyboard 9 and mouse 11. Mouse 11 and keyboard 9 are "user input devices." Other examples of user input devices are a touch screen, light pen, track ball, data glove, etc.

Mouse 11 may have one or more buttons such as buttons 13 shown in FIG. 1. Cabinet 7 houses familiar computer components such as disk drives, a processor, storage means, etc. As used in this specification "storage means" includes any storage device used in connection with a computer system such as disk drives, magnetic tape, solid state memory, bubble memory, etc. Cabinet 7 may include additional hardware such as input/output (I/O) interface cards for connecting computer system 1 to external devices such as an optical character reader, external storage means or other computers and additional devices.

Figure 2:
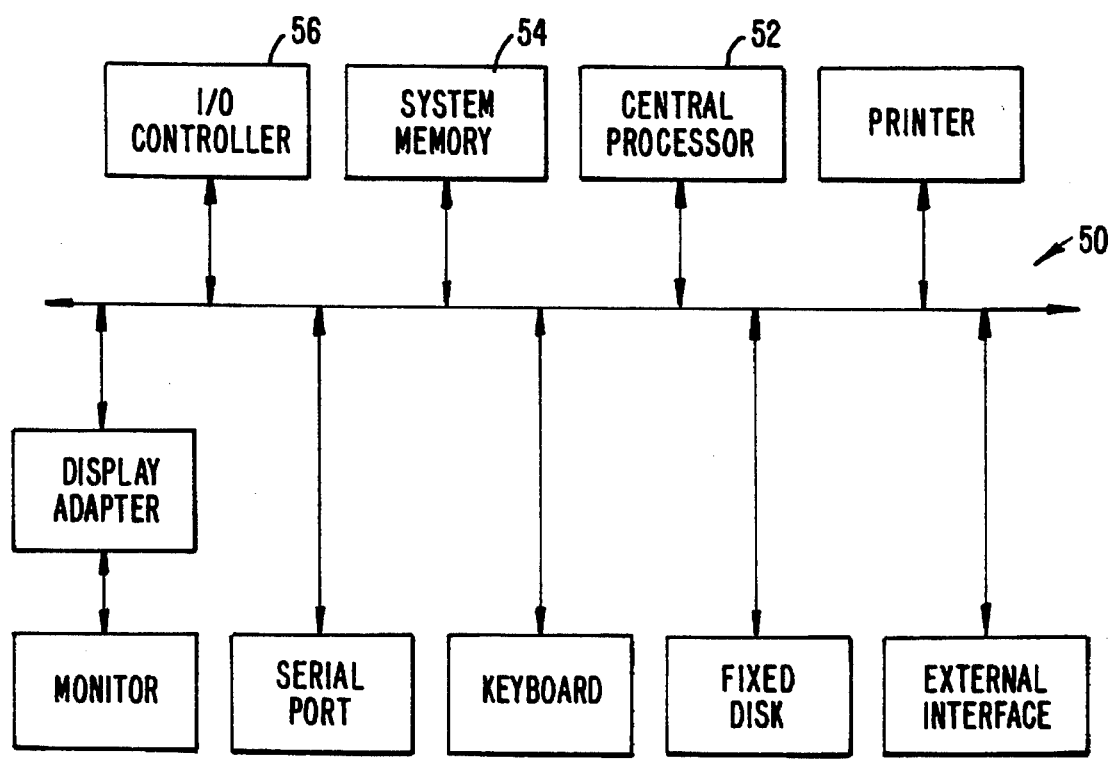
FIG. 2 is a diagram of the subsystems of the computer system of FIG. 1 and their interconnections.

FIG. 2 shows the bus interconnection of basic subsystems of the computer system of FIG. 1. In FIG. 2, bus 50 allows subsystems such as central processor 52 to transfer data to and from system memory 54 and I/O controller 56. Communication with other subsystems is possible as shown in FIG. 2.

Figure 3:
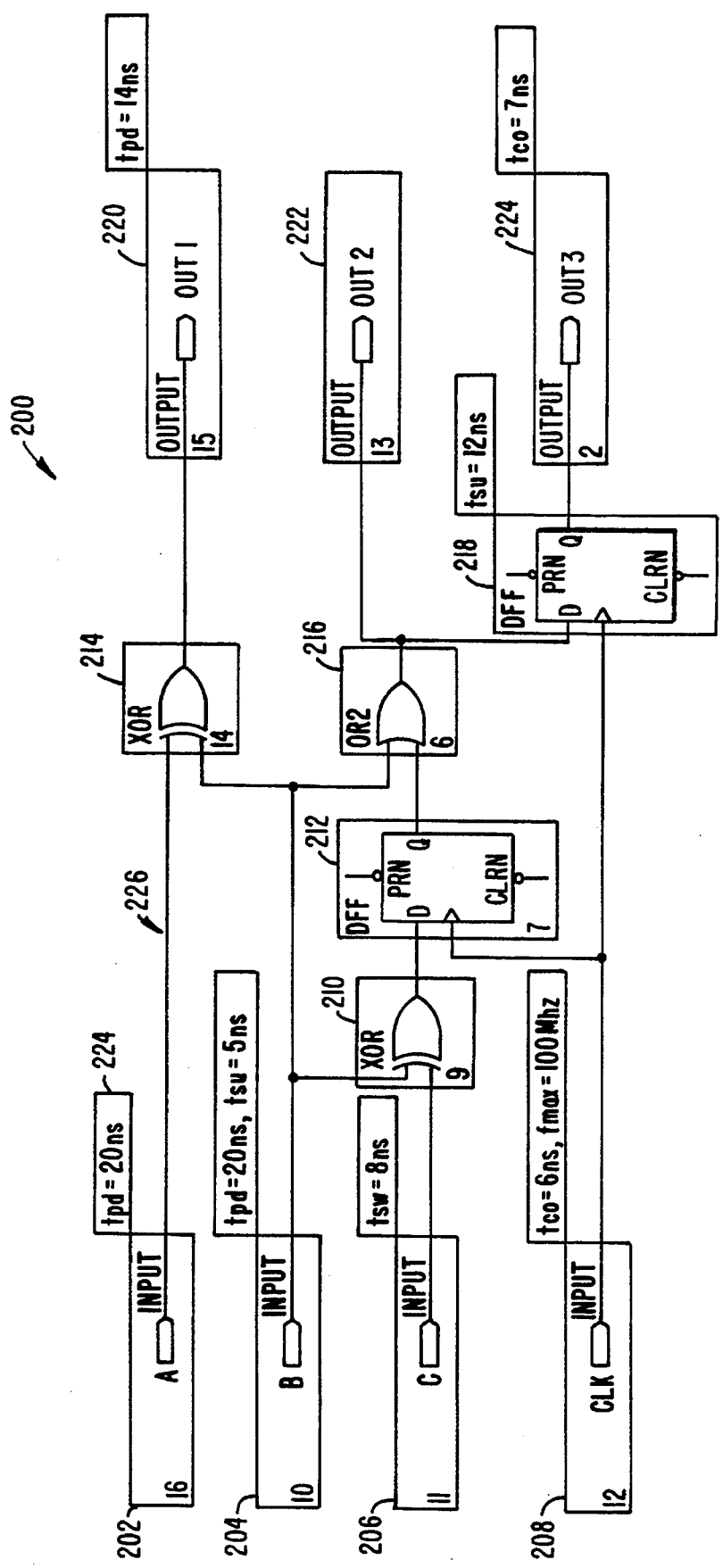
FIG. 3 shows a first circuit used to illustrate the present invention.

FIG. 3 shows a schematic diagram 200 of a simple circuit that will next be used to discuss the present invention. The schematic diagram is shown substantially as it appears on a display screen, such as display screen 5 of computer system 1 of FIG. 1, when the software of the present invention is executing. Schematic 200 shows circuit elements such as inputs 202–206, clock signal 208, logic elements 210–218 and outputs 220–224.

Each element is surrounded by a bounding box containing the element, a label, a node number and optional other information. Some information, including the timing specifications, is attached to the box rather than contained within it. The element, and information associated with the element, is referred to as a "node." Node numbers are located in the lower-left corner of the bounding box. A node's timing specification is attached to the bounding box at the upper-right corner. For example, specification 224, "$t_{pd}$=20 nS", is attached to box 202. Timing specifications are optional and there may be multiple timing specifications for a single node.

In this discussion, nodes are referred to by their drawing reference numbers. Thus, in FIG. 3, timing specifications are shown for node 202 as $t_{pd}$=20; node 204 as $t_{pd}$=20 and $t_{su}$=5; node 206 as $t_{su}$=8; node 208 as $t_{co}$=6 and $f_{max}$=100; node 220 as $t_{pd}$=14 and node 224 as $t_{co}$=7. In a preferred embodiment, units for time quantities are assumed to be nanoseconds (nS) while frequencies, such as the frequency $f_{max}$ specified for node 208, are assumed to be in megahertz.

Assignment of Timing Specifications

Timing specifications may be assigned only to nodes and not, for example, along connecting wires such as wire 226 that connects input node 202 with the XOR gate of node 214. Another embodiment could allow timing specifications to be assigned to connecting wires. An embodiment of the present invention takes into account wire delays in analyzing timing specifications as explained below.

The user assigns timing specifications to nodes in the circuit and the circuit is analyzed and optimized according to the specifications. User assignment of timing specifications is by an appropriate user interface. The user interface in a preferred embodiment allows a user to selectively assign a value for a timing specification for the entire circuit, multiple nodes or a single node. Since each input, output and gate belongs to a separate node, timing specifications may be assigned at .virtually any point in the circuit.

Once specifications have been assigned by the user, any conflicts or ambiguities in the assigned specifications are resolved by the computer system. The analysis step includes using the computer system to determine whether the timing specifications are met by the user's design. The optimization step includes redesigning portions of the circuit design to better fit the timing specifications, if possible. The present invention only deals with the assignment and analysis of timing specifications. A commercially available product incorporating portions of the present invention is MAX+ Plus II Version 4.0, by Altera Corporation.

In addition to assigning timing specifications to nodes, the user can designate a node to be a "timing cut-off" for a selected timing specification. This means that all paths that pass through the node with the timing cut-off are ignored with respect to the selected specification. A timing cut-off is designated by displaying, e.g., pd "$t_{pd}$=Timing Cut-off" associated with a node. User specified timing cut-offs are useful to prevent paths from being analyzed as determined by the designer. Certain types of nodes will automatically have timing cut-offs associated with them when the node has properties that are incompatible with analyzing the node with respect to a certain timing parameter, such as the $t_{pd}$ timing cut-off for flip-flops.

Once the user has finished assigning timing specifications to nodes, one embodiment of the invention determines different paths from an input to an output and assigns a timing specification to each path. As an example, a path exists from input C at node 206 through the XOR gate at node 210, through the D-latch at node 212, through the OR gate at 216 to end at output OUT2 of node 222. In traversing this path, the only node with a timing specification is node 206 with $t_{su}$=8 nS. Thus, the timing specification for this path is $t_{su}$=8 nS. If no timing specification had been assigned to node 206 the path would be without a user-assigned timing specification. In this case, a default timing specification is used. The user has the option of designating default timing specifications that are used whenever a path does not contain a node with a timing specification. If the user does not designate default timing specifications then the system provides default values of +infinity (i.e., the largest value that can be represented in the computer system) for $t_{pd}$, $t_{su}$ and $t_{co}$, and 0 Mhz for $f_{max}$. These system provided defaults essentially mean that the parameters are ignored since they are the least constraining values for the specifications.

A second path exists from input B through node 216 to the output, OUT2. This second path has two nodes in common with the first path, above, namely nodes 216 and 222. A timing specification assigned to either of nodes 216 or 222 would have the potential of being applied to both the first and second paths. By allowing timing specifications to be assigned to internal or "buried" nodes (i.e., nodes other than nodes corresponding to input and output pins) the timing specification can be shared by more than one path. This allows different timing parameters to be assigned to multiple paths that start at the same input pin.

Figure 4:
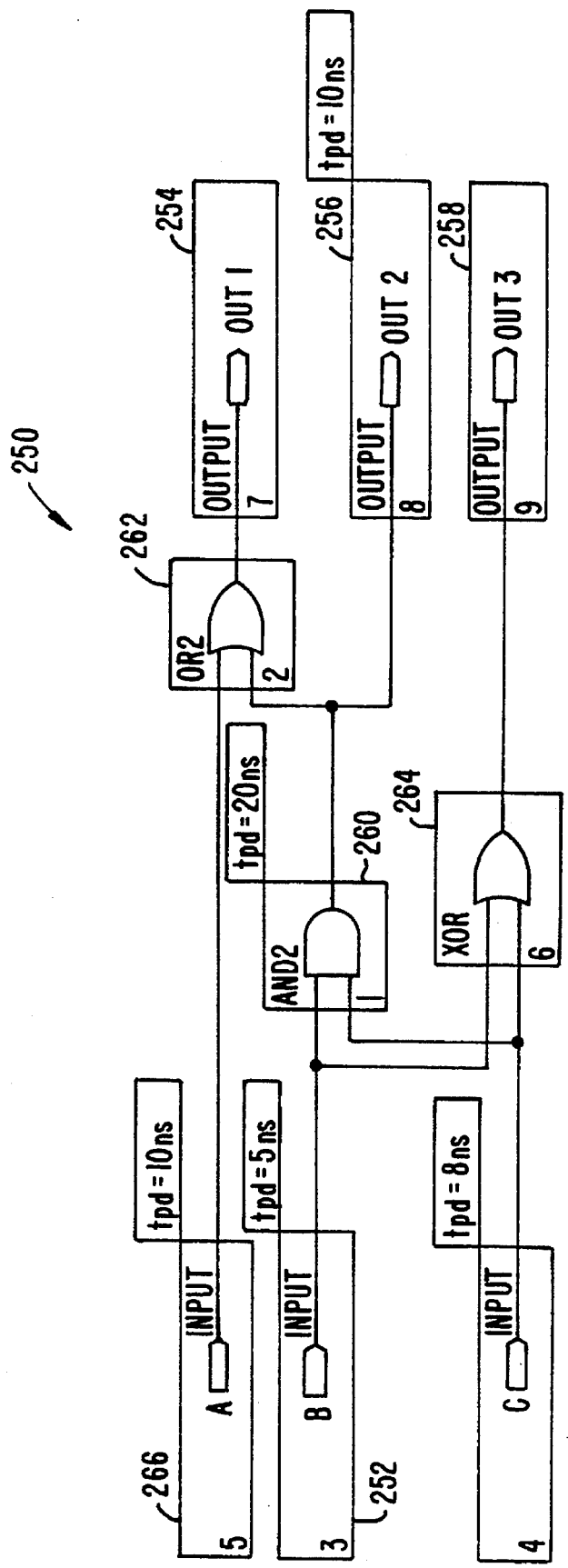
FIG. 4 shows a second circuit that illustrates the advantages of allowing timing specifications on buried nodes.

FIG. 4 shows a second circuit that illustrates the advantages of allowing timing specifications on buried nodes. In FIG. 4, circuit 250 includes input B at input node 252, output OUT1 at output node 254, output OUT2 at output node 256 and output OUT3 at output node 258. Buried node 260 has a timing specification of $t_{pd}$=20 Ns. Other buried nodes are node 262 and node 264. Input node 252 has a timing specification of $t_{pd}$=5 nS.

Input node 252 is the origin for three separate paths that feed each of the output nodes. A first path is node 252, node 260, node 262 and node 254, referred to as first path 252/260/262/254. The other two paths are second path 252/260/256 and third path 252/264/258. The present invention uses a rule of timing specification selection that the timing specification closest to an output node is the timing specification assigned to the path. Thus, for the three paths described above, the $t_{pd}$ value for first path 252/260/262/264 is 20 Ns. The $t_{pd}$ value for second path 252/260/256 is 10 nS and the $t_{pd}$ value for third path 252/264/258 is 5 nS.

Thus, three different timing specifications are specified for three paths that originate from a common input node. The present invention makes this possible by allowing a timing specification to be assigned to a buried node and by using the rule of timing specification selection that the specification closest to the output node is the specification assigned to the path. The same result cannot be achieved merely by assigning different timing specifications to each output node since no other timing specification would be possible for other paths also using the same output node. As an example, other path 266/262/254 has a $t_{pd}$=10 nS. If the timing parameter $t_{pd}$=20 nS of first path 252/260/262/254 were assigned to output node 254 this would override the timing parameter of other path 266/262/254.

Returning to FIG. 3, node 204 has two timing specifications, $t_{pd}$=20 nS and $t_{su}$=5 nS. Thus, multiple timing specifications can be assigned to a single node. However, certain timing specifications may only be assigned to certain types of nodes. For example, a $t_{su}$ specification for a pin which is only used as a clock will result in a warning. Another example that generates a warning is an $f_{max}$ specification on a pin that is not used as a clock.

Since each node may have multiple timing specifications, and since there may be many nodes on a path, it is likely that a path will have more than one type of timing specification and more than one timing specification per type. A preferred embodiment of the invention only optimizes a path for a single timing specification per path. However, all of the paths are analyzed for each type of timing specification that may be assigned to one or more nodes in the path. If the circuit fails to meet any of the user's specifications then an error is reported.

A single timing specification is chosen for optimization because it may not be possible to optimize multiple timing specifications simultaneously. "Selection rules" are applied to simplify the optimization to just a single specification for each path. The following selection rules are used to select one timing specification to assign to a path for the optimization step which is performed at a later time:

1. Use $t_{co}$ if the node eventually feeds (i.e., directly feeds or feeds through one or more combinatorial gates) a register's clock input.

2. Use $t_{su}$ if the node eventually feeds a register's data input.

3. Use $t_{pd}$ if the node combinatorially feeds an output pin.

Using the rules above, $t_{pd}$=20 nS is assigned to path 204/216/222 of FIG. 3. This is because even though $t_{su}$=5 nS is a candidate to assign to the path, the final node in the path, node 216, combinatorially feeds an output pin and, according to rule 3, $t_{pd}$ should be used over $t_{su}$ in this case.

For the purpose of applying the selection rules, nodes that feed to a register's asynchronous clear, preset, load or load data are considered to be controlled by $t_{pd}$ specifications. Nodes that feed a latch data or a latch enable are also considered by their $t_{pd}$ specifications. However, nodes feeding the clock enable of a register will need to satisfy the appropriate $t_{su}$ specification. A specification of $t_{su}$ on a clock pin will have no effect.

Figure 5:
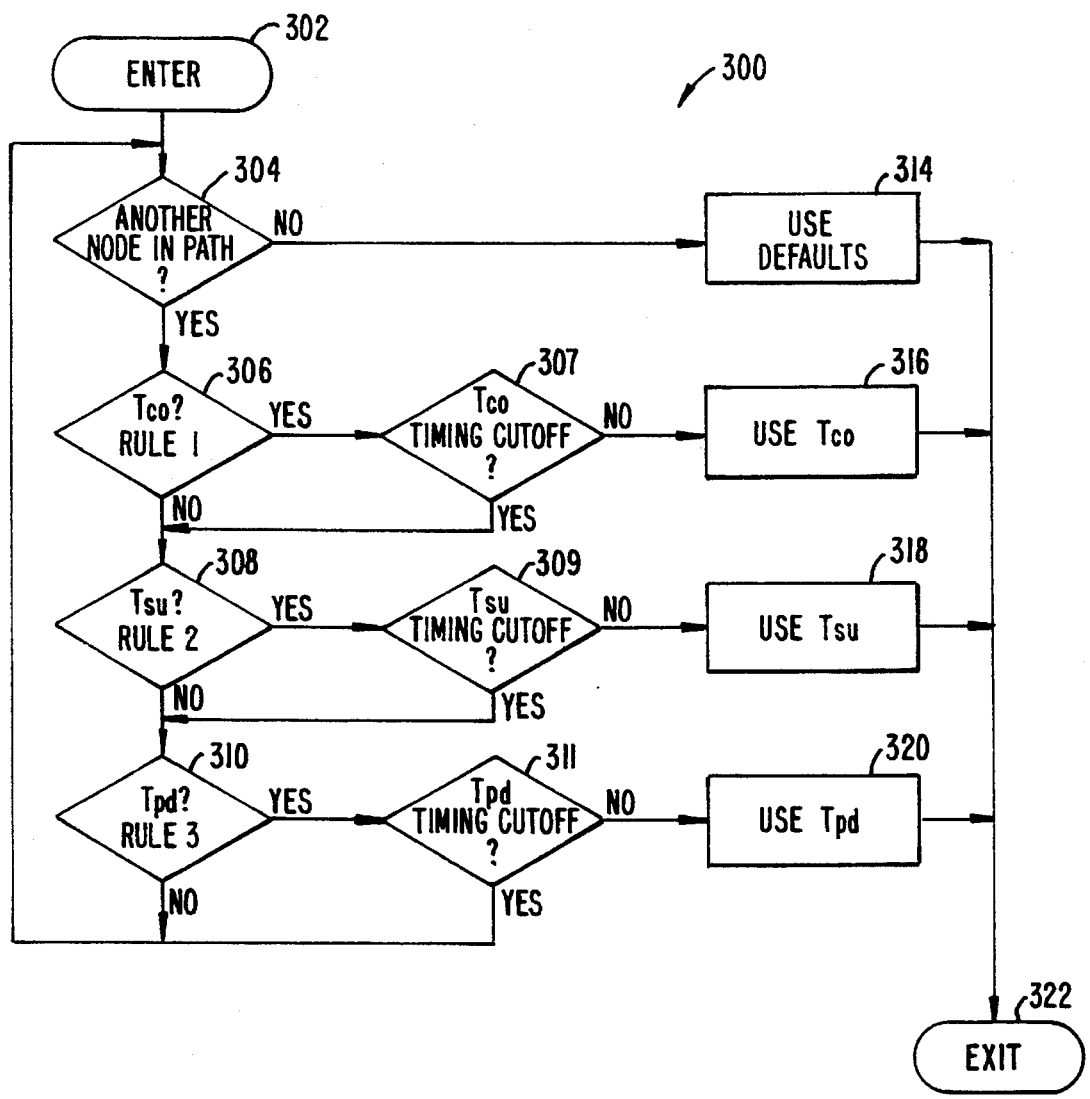
FIG. 5 is a first flowchart illustrating a routine for assigning a single timing parameter to a path.

FIG. 5 illustrates flowchart 300 which shows steps of a method to assign a single timing parameter, from potentially multiple parameters of different types, to a path. In the present invention, the steps of flowchart 300 are automated by software executing on a computer system. The implementation of flowchart 300 of FIG. 5 onto a computer system, as with any flowchart presented here, can be by any means as is known in the art. Any suitable programming language can be used and the steps involved may deviate from those shown in the flowchart. For ease of discussion, steps of the flowchart in FIG. 5 will be spoken of as a single "routine". However, they may be implemented as two or more routines, modules, processes, etc., executing under any type of computer architecture.

The routine of flowchart 300 is entered at 302. Upon entry, a path in the circuit to be analyzed is passed to the routine. At step 304 a check is made as to whether there are any nodes in the path that have not been examined for the existence of an assigned timing specification. Nodes in the path are checked for assigned timing specifications by working backwards starting from the output node. If no specifications are found then execution of the routine proceeds to step 314 where a default value is provided for the timing specification for the path. In the preferred embodiment, default values are specified for $t_{pd}$, $t_{su}$, $t_{pd}$ and $f_{max}$, either by the user or by the system. One of the default values is selected according to the selection rules discussed above. Step 314 assigns the default value to this path and the routine of flowchart 300 exits, thus providing a timing specification associated with the path passed to the routine.

Returning to step 304, if an unchecked node exists then the specification is used for further processing starting with step 306. At step 306 a check is made as to whether the timing parameter closest to the output node is $t_{co}$. If so, Rule 1 is applied to see whether $t_{co}$ is the timing specification to be assigned to the path. Rule 1 states that $t_{co}$ is to be used if the node to which the $t_{co}$ timing specification is assigned eventually feeds or registers a clock input. If rule 1 is met, execution proceeds to step 307 where a check is made to determine if a timing cutoff for $t_{co}$ has been specified on the path. If so, execution returns to step 308. If no timing cutoff for $t_{co}$ is present in the path then step 316 is executed to assign $t_{co}$ as the specification used for later analysis, along with the specified value of $t_{co}$ as the target value for analysis. The routine is then exited at step 322.

If either $t_{co}$ is not specified for the node, application of Rule 1 fails or at $t_{co}$ timing cutoff exists then execution proceeds to step 308 without executing step 316.

At step 308 a check is made as to whether the timing specification $t_{su}$ is associated with the node. In other words, the routine determines, at step 308, whether the node eventually feeds a register's data input. If the timing specification on the node is $t_{su}$ and Rule 2 is met, then execution proceeds to step 309. At step 309 a check is made as to whether there is a $t_{su}$ timing cutoff in the path. If not, $t_{su}$ is used as the timing specification and is associated with the path at step 318 and the routine exits at step 322. If a $t_{su}$ timing cutoff exists for any node in the path then step 318 is not executed. Instead, execution proceeds from step 309 to step 310.

At step 310 a test is made as to whether the timing specification assigned to the node is $t_{pd}$. If so, Rule 3 is applied to check whether the node combinatorially feeds an output pin. If both of these criteria are met then execution proceeds to step 311 where a check is made for the existence of a $t_{pd}$ timing cutoff on the path. Similar to before, if no timing cutoff exists then step 320 assigns the $t_{pd}$ specification to the path and the routine exits at step 322. Otherwise, execution returns to step 304 where a check is made for any other nodes in the path that remain to be checked for timing specifications.

The loop of steps 304, 306, 308 and 310 proceeds to traverse the path backwards from the output node looking for timing specifications. If a timing specification is encountered and the specification meets any of the checks of 306, 308 or 310 then, assuming no timing cutoff for the specification, the timing specification is assigned to the path and used in analysis as described below. Otherwise, a default timing specification is eventually assigned to the path.

Thus, it has been shown that the routine of flowchart 300 assigns a single timing specification to each path in a circuit. The routine of flowchart 300 is an example of a method that may be used to associate a single timing specification with a path. Many modifications to the flowchart are possible without deviating from the scope of the invention. For example, all of the timing specifications $t_{co}$, $t_{su}$, $t_{pd}$ and $f_{max}$ need not be used in a particular embodiment. Or, additional timing specifications may be used. Also, the provision for assignable timing cut-offs is not essential but provides a useful feature.

Additional methodologies for obtaining a single timing specification per path are possible such as using the timing specification farthest away from the output node. The use of four timing specifications and the rules and order in which they are evaluated is advantageous to a circuit designer in that the timing specifications are given in data sheets commonly used in the industry. The rules also make intuitive sense to a designer.

In order to further illustrate the method of flowchart 300, a detailed example will next be discussed applying the method to a path in the circuit of FIG. 3.

FIG. 3 shows a path of nodes 202, 214 and 220 (i.e., path 202/214/220). Assuming this path is passed to the routine of flowchart 300 at step 302, the check at step 304 determines that there are nodes left on the path. Since the check for timing specifications proceeds backwards from the output of the path, output node 220 is checked and the timing specification $t_{pd}$=14 nS is encountered. Execution will therefore proceed to step 306 where a check is made as to whether the timing specification is a $t_{co}$ specification.

In this case, the timing specification for the current node, i.e., the output node, under evaluation by the routine is $t_{pd}$. Thus, execution proceeds to step 308 where a check is made to determine whether the timing specification is $t_{su}$. It is not, so execution proceeds to step 310. 310 looks for a $t_{pd}$ specification which is the same specification type assigned to node 220.

Next, Rule 3 is applied in an attempt to eliminate the timing specification, however, since the timing specification itself is at an output "pin", or node, the test of whether the node combinatorially feeds an output pin is not relevant and the specification is not eliminated. Next, step 311 is executed to check whether a timing cutoff for $t_{pd}$ values exists in the path. Since no timing cutoff exists in the path 202/214/220 execution proceeds to step 320 where $t_{pd}$=14 nS is assigned to the path and the routine exits at step 322. Subsequent calls of the routine of flowchart 300 are performed to assign timing specifications to the remaining paths in circuit 200 of FIG. 3.

To further illustrate the method of flowchart 300 assume that node 220 had not been assigned a timing specification by the user. In this case, execution continues from the above example since $t_{pd}$ is not detected at step 310. Execution returns to step 304 where a check is made to evaluate the next node. In this case node 214 is the next node which does not have a timing parameter associated with it. Thus, the tests at 306, 308 and 310 all fail and execution returns again to step 304.

At this point, node 202 is the current node with $t_{pd}$=20 nS. Steps 306 and 308 fail in their tests and execution proceeds to step 310. At step 310, $t_{pd}$ is detected as the timing specification assigned to the node and Rule 3 is applied. In this case, this input node feeds node 214 which is an XOR gate. Since this is a combinatorial feed to the output pin at node 220, the Rule 3 criterion is satisfied. Step 320 of flowchart 300 is then executed to assign $t_{pd}$=20 nS to the path and the routine exits at step 322.

Figure 6:
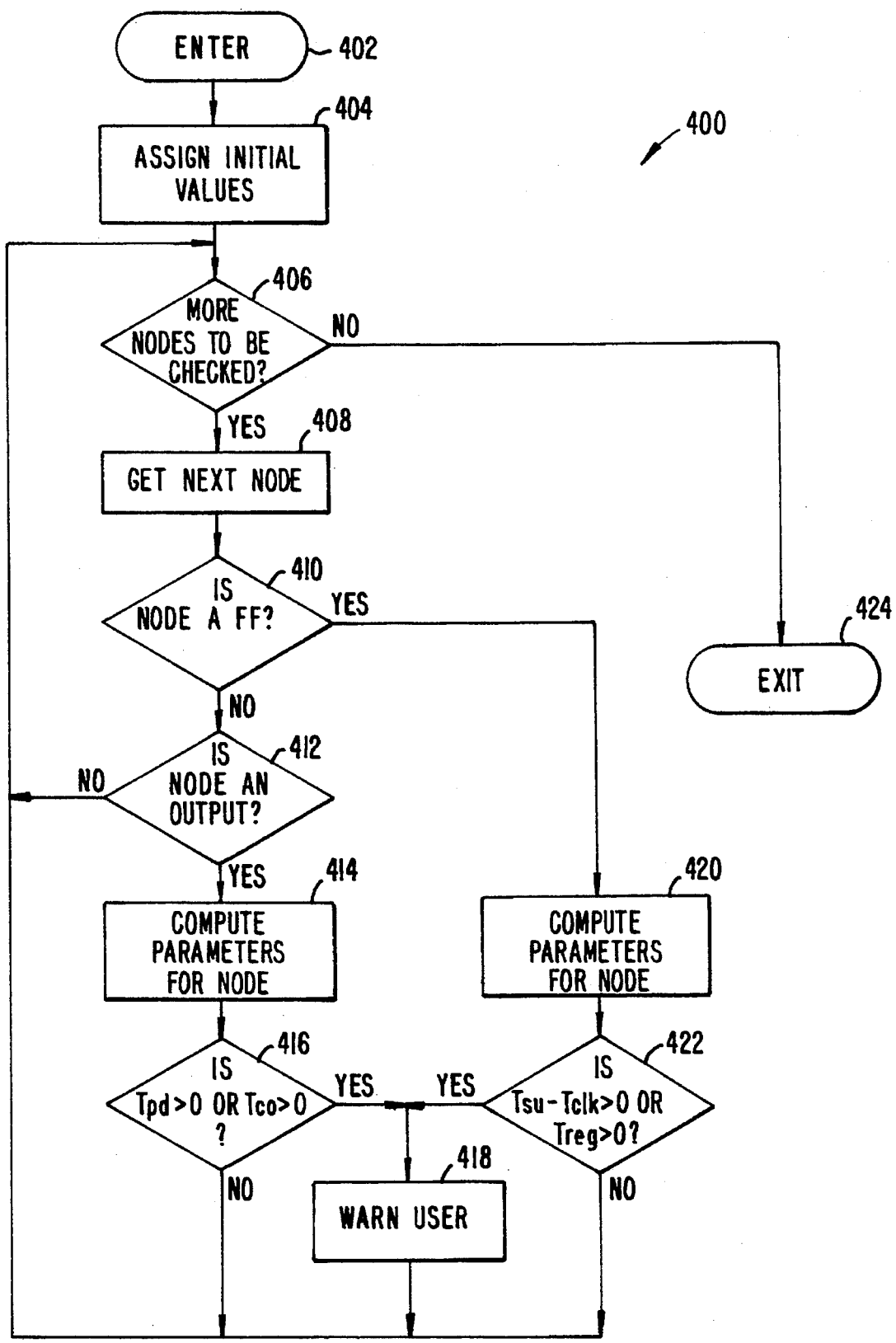
FIG. 6 is a first portion of a routine that analyzes whether constraints specified by timing specifications are met.
Figure 7:
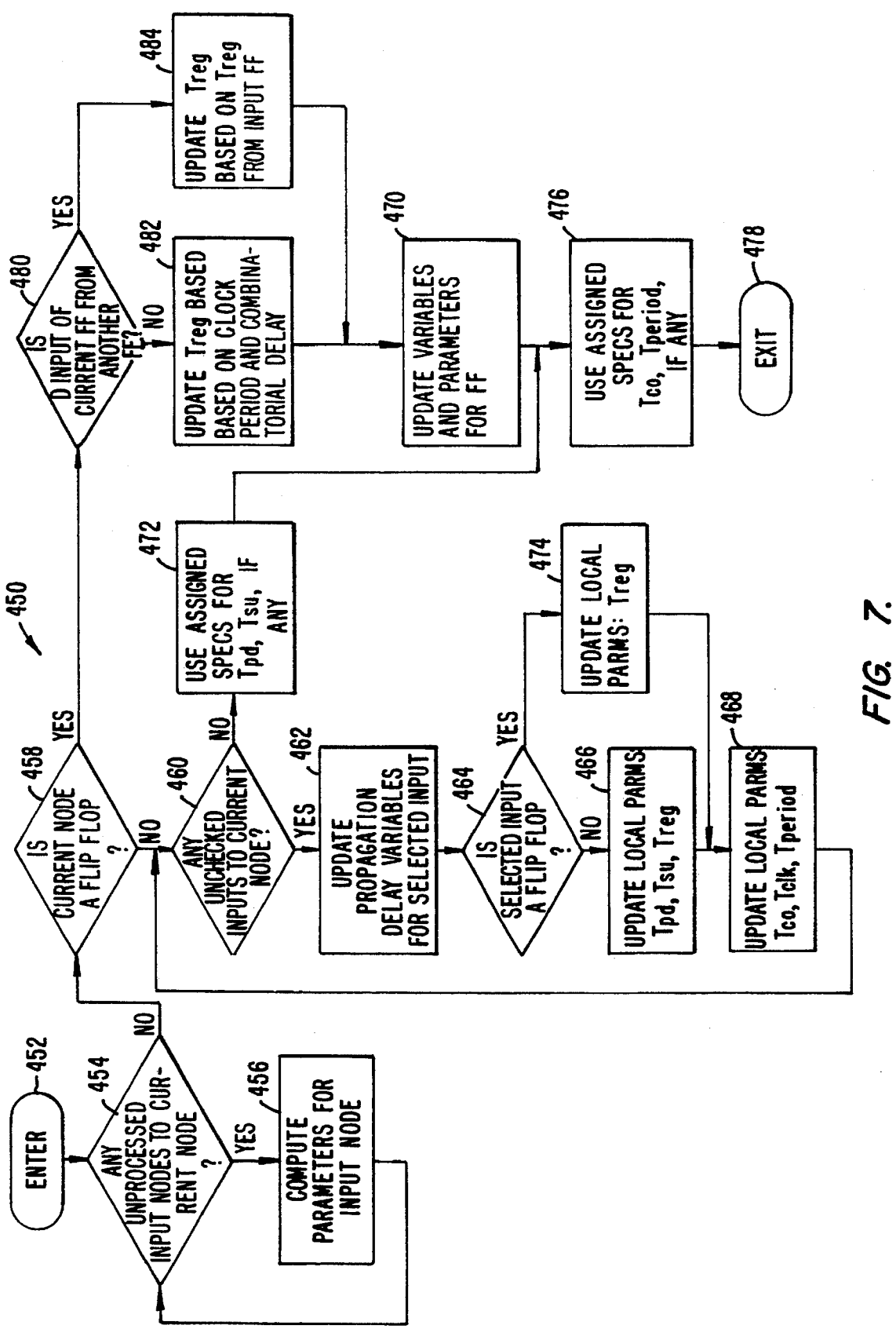
FIG. 7 is a second portion of a routine that analyzes whether constraints specified by timing specifications are met.

Next, FIGS. 6 and 7 are discussed to describe a preferred embodiment for a method to analyze whether constraints specified by assigned timing specifications are met. The constraints are met if the "timing property" of a path is within the timing specification corresponding to the timing property. For example, for the timing specification $t_{pd}$ the corresponding timing property is the propagation delay of a signal through the path. For the timing specification $t_{co}$ the corresponding timing property is the clock-to-output delay from the active clock edge to the outputing of a signal propagating along the path. For the timing specification $t_{su}$ the corresponding timing property is the setup time for a signal on the path respective to a clock's active edge (for flipflops in the path). The timing specification $f_{max}$ does not have a corresponding timing property but is used to determine whether other related timing properties, such as register to register delay, are met. Other timing specifications, such as $t_{period}$ are derived from $f_{max}$.

Essentially, the method according to the flowcharts starts with an output node and traces the output node backwards to one or more input nodes. Next, the input nodes that are part of the traced path are taken in turn and forward traced while keeping track of timing properties and timing specifications, if any. The running total uses local parameters corresponding to each timing parameter and initially sets these local parameters to a large negative value. When a timing specification is encountered the specification value is made negative and is used in place of the large negative member as the local parameter. As the path is forward traced the propagation delays due to gates, flipflops (FFs), storage elements, etc. is selectively added to the local parameter thus incrementing it towards 0. As long as the local parameter remains negative (at least in the case of Tpd, Tco, and Treg) the timing property of the path is said to meet the timing constraint specified by the user.

The method uses a recursive routine programmed on a computer that implements the rules for timing parameter selection described above in an efficient way. In analyzing whether or not the timing properties of a path meet the timing constraints of the timing specifications, two timing specifications, $t_{pd}$ and $t_{su}$, are actually used for combinatorial logic. Where storage elements or flipflops are used the timing specification of $t_{su}$, and the timing parameters Tclk and Treg are considered. In a preferred embodiment, if Tclk exceeds $t_{su}$ for a path the setup time for the path is deemed exceeded and a warning message is generated.

The analysis described in FIGS. 6 and 7 also performs the task of determining a timing specification to be used from multiple timing specifications in a path as discussed above in connection with FIG. 5. The analysis uses some of the rules discussed above in connection with FIG. 5 and applies the rules concurrently with the actual analysis on a node-by-node basis.

FIGS. 6 and 7 show two flowcharts that correspond to routines in the pseudo code of Appendix A. Flowchart 400 of FIG. 6 corresponds to the routine "Check_Network" in Appendix A. Flowchart 450 of FIG. 7 corresponds to the routine "Compute_Slack" of Appendix A. The pseudo code should be consulted for details of the specific implementation of the flowcharted routines in a preferred embodiment. A description of data structures used in the pseudo code is also provided in Appendix A.

Analysis of an Output Node

FIG. 6 shows flowchart 400 that describes a routine for analyzing timing specifications. The routine is entered at step 402 after the user has finished assigning timing specifications to nodes. At step 404 initial values are assigned to various arrays and variables that are used to keep track of parameters in executing the method. At step 406 a check is made as to whether there are nodes left to be analyzed in the circuit. Assuming that the circuit of FIG. 3 is used as the input to the method of flowchart 400 when step 406 is first encountered, none of the nodes have yet been checked so that execution proceeds to step 408.

At step 408 an unchecked node is selected. Any method for selecting an unchecked node in turn may be employed. Steps 410 and 412 check whether the node is a flipflop or an output node. If the node is neither a flipflop nor an output node, execution returns to step 406 and 408 where remaining nodes are selected and checked in turn. Thus, nodes such as 202, 204, 206 and 208 are ignored by the loop 406–412 since they are input nodes and are neither flipflops nor output nodes.

A preferred embodiment of the invention simplifies the analysis by recursing backwards along paths from an output pin or a flipflop. This is an efficient approach given the timing specifications of $t_{pd}$, $t_{su}$, $t_{co}$ and $f_{max}$, because each of these specifications relates to "input pin to output pin" delay, "input pin to register" delay or "register to register" delay. That is, working backwards from an output pin to an input pin, from a flipflop to an input pin or from a flipflop to another flipflop provides all of the information necessary to analyze the timing specifications. Thus, the complexity of the software and the time to perform the analysis is reduced by this approach. Other approaches for analyzing the timing specifications are possible.

The present invention handles asynchronous latches, memory locations and, in general, other circuit elements capable of storing a signal state similarly to the way a flipflop node is handled. Thus, even though the discussion uses the term "flipflop" for convenience, it should be understood that the discussion pertains as well to other types of storage elements.

When node 212 is selected at step 408 as the next node to be checked, step 410 detects that this node is a flipflop and execution proceeds to step 420. At step 420 parameters are computed for the node. Step 420 is the routine "Compute_Slack" of Appendix A as described in the pseudo code. The result of executing step 420 is that parameters such as Tsu, Tclk and Treg are given values.

The parameters Tsu, Tclk and Treg are not timing specifications such as $t_{su}$ and $t_{pd}$. Instead, timing parameters (distinguished from timing specifications by a capitalized first letter) such as Tsu, Tclk and Treg contain values that are updated throughout the analysis to indicate whether timing properties of paths in the circuit of FIG. 3 meet constraints as dictated by timing specifications on nodes in the circuit. A timing parameter of the same name as a timing specification corresponds to the specification. Other timing parameters, such as Treg do not have a corresponding timing specification and are, instead, related to one or more of the timing specifications. For example, Treg is used to determine the register to register delay which is constrained by the timing specification Fmax.

The routine of flowchart 400 uses the final timing parameter values to determine whether constraints are met. If Tsu–Tclk>0 or if Treg>0, it is an indication that timing properties of the circuit of FIG. 3 have exceeded constraints imposed on the circuit by the designer's timing specifications and timing specification values. If a constraint is exceeded then execution proceeds to step 418 where the user is given a warning message. Execution then proceeds to step 406 where the next node to be checked is determined.

Assuming that step 408 obtains the next node as node 220 of FIG. 3, the check at step 410 determines that the node is not a flipflop and execution proceeds to step 412. At step 412 node 220 is determined to be an output node and execution continues to step 414 where the routine to compute parameters for the node is invoked as in step 420. After executing step 414, parameters have been assigned to values such as Tpd and Tco. Step 416 checks to see whether the parameters indicate that the circuit of FIG. 3 is within the constraints of the timing parameters specified by the user. For an output node, this is done by having Tpd≦0 and having Tco≦0. If either of these conditions are not met, execution goes to step 418 where the user is given a warning indication. If, instead, the conditions are met execution returns to step 406 where more nodes to be checked are looked for.

After all nodes have been checked, execution proceeds from step 406 to exit the routine at step 424.

The routine of flowchart 400 is but one method of analyzing the timing properties of a circuit of FIG. 3. As mentioned above, other timing specifications can be used rather than the propagation delay, set up time, clock to output delay or maximum frequency of the clock (which is used to constrain register to register delays) in determining timing properties of the circuit. Depending on the specific implementation, steps such as 416 and 422 which determine whether timing properties are within the constraints of timing specifications will differ. Also, steps may be added to, or omitted from, the basic steps presented in FIG. 6 and other flowcharts herein without departing from the scope of the invention.

FIG. 7 shows flowchart 450 which describes a routine for performing the task of computing parameters for a node. The routine of FIG. 7 is recursive in that it calls itself at step 456.

Table I shows the values of local parameters and variables for various nodes in the logic diagram in FIG. 3 as they are assigned during the course of performing the routine of flowchart 450 of FIG. 7. Table I should be consulted in conjunction with the discussion below to provide a further understanding of the operation of the routines in the pseudo code of Appendix A.

TABLE I

| Node 202 | Tpd_spec = 20ns |
| --- | --- |
| | Tpd = −20ns |
| | pp = 0ns |
| | cp = 0ns |

TABLE I-continued

| Node | Parameters |
|---|---|
| Node 204 | Tpd_spec = 20Ns |
| | Tsu_spec = 5ns |
| | Tpd = −20ns |
| | Tsu = −5ns |
| | pp = 0ns |
| Node 206 | Tsu_spec = 8ns |
| | Tsu = −8ns |
| | pp = 0ns |
| | cp = 0ns |
| Node 208 | Tco_spec = 6ns |
| | Fmax_spec = 100MHz |
| | Tco = −6ns |
| | Tperiod = 10ns |
| | pp = 0ns |
| | cp = 0ns |
| | Tclk = 0ns |
| Node 210 | Tpd = −17ns |
| | Tsu = −2ns |
| | pp = 3ns |
| | cp = 3ns |
| Node 212 | Tco = −3ns |
| | Tsu = 1ns |
| | Tperiod = 20ns |
| | Tclk = 3ns |
| | pp = 0ns |
| | cp = 3ns |
| | Tclk = 3ns |
| Node 214 | Tpd = −17ns |
| | pp = 3ns |
| | cp = 3ns |
| Node 216 | Tpd = −17ns |
| | Tsu = −2ns |
| | Tco = 0ns |
| | pp = 3ns |
| | cp = 6ns |
| Node 218 | Tsu_spec = 12ns |
| | Tsu = −6ns |
| | Tco = 3ns |
| | Tperiod = 20ns |
| | pp = 0ns |
| | cp = 3ns |
| | Tclk = 3ns |
| Node 220 | Tpd_spec = 14ns |
| | Tpd = −8ns |
| Node 222 | Tpd = −14 |
| | Tco = 3ns |
| Node 224 | Tco_spec = 7ns |
| | Tco = 3ns |

In the pseudo code, Compute_Slack performs steps 460, 462, 464, 466, 474 and 468 at lines 14–30 of the routine as shown in Appendix A. In Compute_Slack, internal variables pp and cp are arrays that hold delay values for propagation and clock to output delays, respectively. Arrays such as pp and cp keep the delay times in terms of nanoseconds. These values are used to compute local parameters Tpd, Tsu, Treg, Tco, Tperiod, etc. The local parameters are initially set to a large negative number and are selectively incremented with the positive numbers kept in the pp and cp arrays. As long as the number in the local parameter remains negative, the timing constraint corresponding to the local parameter is deemed met. This is why, in FIG. 6, the test to give a warning to the user is checking for Tpd>0 or Tco>0 if the node is an output node and the test is Tsu−Tclk>0 or Treg>0 if the node is a flipflop.

The routine of FIG. 7 is entered at step 452 when it is called at either of steps 414 or 420 of FIG. 6 or at step of FIG. 7. The routine of FIG. 7 is called with a current node specified. Using the example of the circuit of FIG. 3, a current node would be, e.g., output node 220. At step 454 a check is made for unprocessed input nodes attached to the current node.

When the routine is first entered, all of the inputs are unprocessed. In this example, node 220 of FIG. 3 has one node attached to it as an input, namely, node 214. Thus, the check at step 454 determines that there are unprocessed input nodes and execution continues to step 456. At step 456 the routine of FIG. 7 calls itself specifying node 214 as the current node. A second instance of the routine is entered at step 452 and the check at step 454 is again made, this time with respect to node 214 of FIG. 3 as the current node.

Node 214 has two input nodes. A first input node is node 202 and a second input node is node 204. Execution proceeds to step 456 where the first of the input nodes to node 214 is processed by again calling the routine of FIG. 7. Thus, the routine of flowchart 450 is entered once again, this time with node 202 as the current node.

With node 202 as the current node, the check at step 454 determines that there are no input nodes to node 202. Execution then proceeds to step 454 where a check is made as to whether the current node is a flipflop (or any storage element). Since node 202 is not a flipflop, step 460 is executed where a check is made as to any unchecked inputs to the current node. Since the current node, node 202, does not have input nodes execution proceeds to step 472 where the routine assigns timing specification values, if any, to Tpd and Tsu. Since node 202 has a timing specification 224 of $t_{pd}$=20 nS as shown in FIG. 3, Tpd is given a value of −20 as shown in the pseudo code by the line "if (has_Tpd_spec [g1]) then let Tpd[g1]:=pp[g1]−Tpd_spec[g1];" (remembering that the 'pp' array has been initialized to zeros by the routine of flowchart 400, as further shown in the pseudo code for the routine "Check_Network"). Since there is no user specification for $t_{su}$, Tsu retains its default value of—infinity, or a very large negative number.

Step 476 then updates the timing parameters Tco and Tperiod if there are any corresponding timing specifications for these parameters—which there are not, in this case. The routine is then exited at step 478.

At this point we are back at the next higher level of instance of the routine of flowchart 450 at step 456. Thus step 454 is executed and the second input node, node 204, is submitted to an instance of the routine.

Using node 204 as the current node the routine is again entered at step 452. At step 454, since there are no inputs to node 204, execution proceeds to step 458 where a check is made as to whether the current node is a flipflop. Since node 204 is an input node and not a flipflop, execution continues to step 460 where a check is made as to the existence of unchecked inputs to the current node. This check results in a negative evaluation and step 472 is executed.

At step 472, as before, local parameters Tpd and Tsu are assigned the value of any user specified timing parameters. Since, for node 204 of FIG. 3, $t_{pd}$=20 nS and $t_{su}$=5 nS, the negatives of these values are assigned, respectively, to Tpd and Tsu. Step 476 is then executed. However, since no Tco or Tperiod is specified for node 204 no assignments to Tco and Tperiod are made. The routine exits at step 478. Note that since we are at a different instance of the routine of flowchart 450, the local parameters for node 204 are not the same as the local parameters for node 202, above. That is, the assigning of values to local parameters for node 204 does not overwrite the values for the local parameters for node 202.

After evaluating node 204, processing is back at step 456 in a previous instance of the routine where node 214 inputs are being considered. At step 454 it is determined that there are no more unprocessed input nodes to node 214 and execution goes to step 458. Since node 214 is not a flipflop, step 460 is performed and a check is made for unchecked inputs to the current node. Since none of the inputs to node 214 have been checked yet, step 462 selects node 202 as the first input to check. Also at step 462, internal variables are updated to keep track of propagation delays within the circuit.

Returning to FIG. 7, step 462 updates the propagation delay variables such as arrays pp and cp. The present example assumes a 3 nS delay for all gates in the circuit of FIG. 3, and an additional 3 nS delay from input pins and the gates they feed. In this case, using node 202 as the input being checked for node 214 there is a propagation delay of 3 nS. This results in a value of 3 assigned to pp[g1] at step 462 of flowchart 450. The array value pp[g1] corresponds to the propagation delay at node 214 via node 202. This value is calculated by the pseudo code statement "let pp[g1]:= max(pp[g1], pp[g2]+delay[g2, g1]);" in Compute_Slack. At the time of calculation, pp[g1] and pp[g2] are both zero and delay[g2, g1] holds the delay value between node 202 and node 214 of 3.

Execution next proceeds to step 464 where, since node 214 is not a flipflop, step 466 is next executed. Step 466 updates the local parameters Tpd, Tsu and Treg. This is done in the pseudo code by the statement "let Tpd[g1]:=max(Tpd [g1], Tpd[g2]+delay[g2, g1];". Remembering that Tpd[g2] is the local parameter for node 202 (i.e., Tpd for node 202) calculated above as −20, and that Tpd[g1] is the local parameter for Tpd for node 214 which is 0 at this point, the delay[g2, g1] value is 3 that results in a −17 value assigned to Tpd[g1], or Tpd for node 214. Essentially, the Tpd local parameters are "carried forward" as negative numbers from nodes that feed the current node while the propagation delays in the path are added in. Thus, Tpd for node 214 is −17.

After local parameters Tsu and Treg are similarly updated at step 466 for node 214, local parameters Tco, Tclock, and Tperiod are updated at step 468. Local parameter Tco is used to keep track of clock-to-output propagation delays in the path. Local parameter Treg is used to keep track of register to register delays in the path and local parameter Tperiod is used to keep track of the minimum clock period specification in the path. The details of updating the local parameters are similar to the present discussion of Tpd. The pseudo code should be consulted for an exact description. Once these parameters have been updated execution returns to step 460 where a test is made for more unchecked inputs to node 214.

At this point, the second input to node 214, from node 204, is checked. Step 462 updates the propagation delay variables for a signal from node 204. Again, the associated gate delay is 3 nS due to the XOR gate at node 214. Execution continues at step 464.

Since node 204 is not a flipflop, step 466 updates the local parameters Tpd, Tsu and Treg, as before. Since this is the second instance of a $t_{pd}$ specification for an input to node 214 (the first input at node 202 also had a $t_{pd}$ specification), the method chooses one $t_{pd}$ value by using the $t_{pd}$ value of greatest magnitude (see the pseudo code statement "let Tpd[g1]:=max(Tpd[g1], Tpd[g2]+delay[g2, g1]);"). In this example, since both $t_{pd}$ values are the same this step is inconsequential.

At step 468 the local parameters Tco, Tclk and Tperiod are again updated. However, these parameters do not enter into the check of the input at node 204 since this input is not a clock input and the node is not a flipflop.

Execution returns to step 460 where, since there are no unchecked inputs, the method next executes step 472. At step 472 user assigned timing specifications are used in place of the local parameters Tpd and Tsu. However, since there are no user assigned timing specifications for the current node, node 214, as shown in FIG. 3, the Tpd and Tsu parameter values remain intact. Execution proceeds to step 476 where, similarly, local parameters Tco and Tperiod are superseded by any user assigned timing specifications corresponding to those local parameters. Again, node 214 has no timing specifications that can be used to supersede the local parameters. Finally, the routine is exited at step 478.

After having processed up to node 214, Tpd=−17 and Tsu=−2. Processing is then at step 456 for computing parameters for input nodes to node 220 in a higher level instance of the recursive routine of FIG. 7.

Since there are no unprocessed input nodes, the check at step 454 brings us to step 458. Since node 220 is an output node and not a flipflop execution continues to step 460. At step 460, node 214 is detected as an unchecked input node and execution proceeds to step 462.

At step 462, propagation delay variables pp and cp are updated. In this case, the XOR gate at node 214 has a gate delay of, e.g., 3 nS.

At step 464, the input to node 220 is determined not be a flipflop and step 466 is next executed. At step 466 the only local parameters of interest in this example, Tpd and Tsu, are updated. At step 468, additional local parameters are updated but they are not of concern in the present example.

Execution returns to step 460 where it is determined that there are no more unchecked inputs to node 220, the current node. At step 472 any user assigned specifications for $t_{pd}$ and $t_{su}$, along with propagation delays, are used to assign values to local parameters Tpd and Tsu. Since node 220 has a user assigned timing specification of $t_{pd}$=14 nS, this value is used to assign pp−$t_{pd}$ or 6−14=−8 to Tpd. The Tpd value is due to the 3 nS delay from the XOR gate at node 214 and the additional 3 nS delay from node 202 to node 214 (remembering that the present example assumes a 3 nS delay between input gates and the gates they feed).

At step 476 Tco and Tperiod are assessed to see if there are user assigned timing specifications. There are none and execution terminates at step 478 of FIG. 7.

Remembering that the discussion of flowchart 450 of FIG. 7 was initiated because this routine is invoked at step 414 of FIG. 6 we are now back to the subsequent step in FIG. 6, namely step 416. Step 416 tests whether Tpd is greater than zero or Tco is greater than zero. As discussed above, Tpd has a value of −8 and Tco, since it was never assigned a value other than the initial value assigned to it, is a large negative number. Therefore, the test at step 416 is false, meaning no timing specification constraints are exceeded, and no warning is issued to the user at step 418. Execution proceeds in FIG. 6 to step 406 where it is determined that there are more nodes to be checked.

Analysis of a Flipflop Node

Next, a second example will be discussed using the flowcharts of FIGS. 6 and 7 in connection with describing the operation of the method with respect to a flipflop, or storage element, analysis.

Returning to flowchart 400 of FIG. 6, assume that after entering the routine at step 402 (again using the circuit 200 of FIG. 3 as the circuit being analyzed), assigning initial values at step 404 and determining that there are more nodes to be checked at step 406, the routine obtains node 212 as the next node for processing at step 408. In this case, node 212 of FIG. 3 is a flipflop, or D-latch, so the check at step 410 causes step 420 to be executed next. At step 420 the routine of FIG. 7 is again invoked, this time with respect to node 212.

Referring to FIG. 7, the routine of flowchart 450 is entered at step 452 with node 212 as the current node. At step 454 it is determined that there are unprocessed input nodes attached to the current node, namely nodes 210 and 208. At step 456 parameters are computed for one of these input nodes. Computing the parameters for node 210 is similar to computation of parameters for a node such as node 214 as discussed above. The outcome of the computation is that node 210 has local parameters Tpd of −20 and Tsu of −5. Also, the propagation variable pp for node 210 is set to 3, assuming a 3 nS delay for the XOR gate. Next step 454 of FIG. 7 is executed and, since there is another unprocessed input node, namely node 208, execution returns to step 456 where node 208's parameters are computed. Since node 208 is a clock input having timing specifications of $t_{co}$=6 nS and $f_{max}$=100 Mhz, the local parameters associated with node 208 are Tco=−6 and Tperiod=10 (Tperiod is $1/f_{max}$).

Once all input parameters have been computed for node 212 execution proceeds to step 458. Since the current node is a flipflop step 480 is next executed to determine whether the input to the flipflop is from the output of another flipflop. In this case, the D input of the flipflop at node 212 is from input node 208 so execution proceeds to step 482 where the local parameter Treg is updated according to the clock period and the combinatorial delay. Had the D input been from a flipflop, instead, Treg for the flipflop at node 212 would be updated from the Treg of the feeding flipflop as shown in the pseudo code. The Treg local parameter is used to check that the register to register delay time is less than the clock period as determined by any existing $f_{max}$ timing specification.

In our present example, after step 482 is executed, Treg for node 212 has the value 3−10=−7 as computed by the pseudo code statement "let Treg[g1]=max(Treg[g1], delay [g2, g1]−Tperiod[g2]);" in routine Compute_Slack. Execution proceeds to step 470 where variables and local parameters for the flipflop are updated. For node 212 local parameters are set as Tsu=1, Tco=−3, Tpd=−14 and Tperiod=20. A preferred embodiment ignores the Treg local parameter computation unless the node is a register being fed by another register.

Since node 212 is a flipflop the propagation delay variable, pp, is set to 0 because gate propagation is not relevant through a flipflop. At step 476 any assigned timing specifications for Tco and Tperiod are used. In this example, node 212 does not have either of these assigned timing specifications. The routine is exited at step 478.

Once local parameters have been assigned to node 212 they can be used as described above in connection with determining whether a path's timing properties meet with constraints as determined by a user's assigned timing specifications. As before, details of the specific embodiment of this method may be found by consulting the pseudo code in Appendix A to which the flowcharts of FIGS. 6 and 7 closely correspond.

In the foregoing specification, the invention has been described with reference to a specific exemplary embodiment thereof. It will, however, be evident that various modifications and changes may be made thereunto without departing from the broader spirit and scope of the invention as set forth in the appended claims. For example, various programming languages and techniques can be used to implement the disclosed invention. Also, the specific logic presented to accomplish tasks described in flowcharts may be modified without departing from the scope of the invention. Many such changes or modifications will be readily apparent to one of ordinary skill in the art. The specification and drawings are, accordingly, to be regarded in an illustrative rather than a restrictive sense, the invention being limited only by the provided claims.

Appendix A

| | |
|---|---|
| Check_Network( ) | A routine that prints a message if the timing specifications are not satisfied for the network. |
| Compute_Slack( ) | A recursive subroutine that computes that slack times for all the timing specifications on a node. |
| N | The number of gates in the network. |
| num_inputs[g] | The number of inputs to gate g. |
| input[g][j] | The gate feeding the j'th input of gate g. |
| input[g][clk]; | The gate feeding the clock input to gate g, if g is a flip-flop. |
| input[g][d] | The gate feeding the d input to gate g, if g is a flip-flop. |
| is_flip_flop[g]; | A Boolean constant that is TRUE if gate g is a clocked storage device. |
| is_output[g] | A Boolean constant that is TRUE if gate g is an output of the network |
| processed[g] | TRUE if gate g has been processed. |
| delay[g1, g2] | The intrinsic delay from gate g1 to gate g2. |
| has_Tpd_spec[g] | A Boolean constant that is TRUE if gate g has a Tpd specification on it. |
| has_Tco_spec[g] | A Boolean constant that is TRUE if gate g has a Tco specification on it. |
| has_Tsu_spec[g] | A Boolean constant that is TRUE if gate g has a Tsu specification on it. |
| has_Tperiod_spec[g] | A Boolean constant that is TRUE if gate g has a clock period specification on it. |
| Tpd_spec[g] | The combinatorial propagation delay specification on gate g. |
| Tco_spec[g] | The clock-to-output delay specification on gate g. |
| Tsu_spec[g] | The setup time specification on gate g. |
| Tperiod_spec[g] | The clock period specification on gate g; |
| infinity | A constant greater than the value of any timing specification. |
| Tpd[g] | The combinatorial propagation delay slack time for gate g. |
| Tco[g] | The clock-to-output slack time for gate g. |
| Tsu[g] | The setup-time slack time for gate g. |
| Tperiod[g] | The minimum clock period of gate [g]. |
| Treg[g] | The register to register delay slack time[g]. |
| Tclk[g] | The minimum clock delay for a flip-flop. |

Appendix A

| | |
|---|---|
| pp[g] | A variable that holds a input to gate propagation delay value for gate g. |
| cp[g] | A variable that holds a clock to gate propagation delay value for gate g. |
| g | A local variable that identifies a gate. |
| g1 | A local variable that identifies a gate. |
| g2 | A local variable that identifies a gate. |
| j | A local variable used as an index into inputs[g1][j]. |

```
Check_Network( )
begin
        let g: = 0;
        while (g < N) do
                let processed[g] = FALSE;
                let pp[g]: = 0;
                let cp[g]: = 0;
                let Tpd[g]: = -infinity;
                let Tco[g]: = -infinity;
                let Tsu[g]: = -infinity;
                let Treg[g]: = -infinity;
                let Tperiod[g]: = infinity;
                let Tclk[g]: = 0;
                let g: = g + 1;
        end_loop;
        let g: = 0;
        while (g < N) do
                if (is_flip_flop[g]) then
                begin
                        Compute_Slack(g);
                        if (Tsu[g] - Tclk[g] > 0 or Treg[g] > 0) print alert message;
                end;
                if (is_output[g]) then
                begin
                        Compute_Slack[g];
                        if (Tpd[g] > 0 or Tco[g] > 0) print alert message;
                end;
                let g: = g + 1;
        end_loop;
end;
Compute_Slack(g1)
begin
        if (processed[g1] == FALSE) then
        begin
        processed[g1]: = TRUE;
                let j: = 0;
                while (j < num_inputs[g1]) do
                        Compute_Slack(input[g1][j]);
                        let j: = j + 1;
                end_loop;
        if (is_flip_flop[g1] == FALSE) then
        begin
                let j: = 0;
                while (j < num_inputs[g1]) do
                        let g2: = input[g1][j];
                        let pp[g1]: = max(pp[g1], pp[g2] + delay[g2, g1]);
                        let cp[g1]: = max(cp[g1], cp[g2] + delay[g2, g1]);
                        if (is_flip_flop[g2] == FALSE) then
                        begin
                                let Tpd[g1]: = max(Tpd[g1], Tpd[g2] + delay[g2, g1]);
                                let Tsu[g1]: = max(Tsu[g1], Tsu[g2] + delay[g2, g1]);
                                let Treg[g1]: = max(Treg[g1], Treg[g2] + delay[g2, g1]);
                        end;
                        else let Treg[g1]: = max(Treg[g1], delay[g2, g1] - Tperiod[g2]);
                        let Tco[g1]: = max(Tco[g1], Tco[g2] + delay[g2, g1]);
                        if (Tclk[g1] == 0) then let Tclk[g1]: = Tclk[g2] + delay[g2, g1];
                        else let Tclk[g1]: = min(Tclk[g1], Tclk[g2] + delay[g2, g1]);
                        let Tperiod[g1]: = min(Tperiod[g1], Tperiod[g2]);
                        let j: = j + 1
                end_loop;
                if (has_Tpd_spec[g1]) then let Tpd[g1]: = pp[g1] - Tpd_spec[g1];
                if (has_Tsu_spec[g1]) then let Tsu[g1]: = pp[g1] - Tsu_spec[g1];
        end;
        else begin
                if (is_flip_flop[input[g1][d]] == FALSE)
                begin
                        if (has_Tsu_spec[g1]) then let Tsu[g1]: = pp[g1] - Tsu_spec[g1];
                        else let Tsu[g1]: = Tsu[input[g1][d]] + delay[input[g1][d], g1];
                        let Treg[g1]: = Treg[input[g1][d]] + delay[input[g1][d], g1];
                end
                else let Treg[g1] = delay[input[g1][d], g1] - Tperiod[input[g1][d]];
                let Tco[g1]: = Tco[input[g1][clk]] + delay[input[g1][clk], g1];
```

-continued

Appendix A

```
        let cp[g1]: = cp[input[g1][clk]] + delay[input[g1][clk], g1];
        let pp[g1]: = 0;
        let Tclk[g1]: = Tclk[input[g1][clk]] + delay[input[g1][clk], g1];
        let Tperiod[g1]: = 2 * Tperiod[input[g1][clk];
end;
if (has__Tco_spec[g1]) then let Tco[g1]: = cp[g1] – Tco__spec[g1];
if (has__Tperiod__spec[g1]) then let Tperiod[g1]: = Tperiod__spec[g1];
end
```

What is claimed is:

1. A method for applying timing specifications in a logic design, wherein the logic design includes logic design inputs, logic design outputs and a plurality of logic elements coupled together to form at least one path from a logic design input to one or more logic design outputs via the plurality of logic elements, wherein a logic element includes at least one logic element input and at least one logic element output for coupling to other logic elements, the logic design inputs and the logic design outputs, wherein each logic element, logic element input, logic element output, logic design input and logic design output comprises a node, wherein one or more nodes exist on the paths, the method executing on a computer system operated by a human user, the computer system including a processor coupled to a user input device and an output device, the method comprising the steps of:

(a) inputting a timing specification by a user using the user input device, wherein the timing specification comprises a timing parameter assigned to a first user-selected node in a path;

(b) using the processor to identify a path that originates at a logic design input, passes through the first node, and terminates at a logic design output;

(c) using the processor to determine a timing property of an electrical signal transmitted through the identified path, wherein the timing property corresponds with the timing parameter;

(d) using the processor to compare the timing property of the identified path with the timing parameter; and (e) using the output device to indicate the relationship of the identified path's timing property to the timing parameter.

2. The method of claim 1, wherein the identified path includes a first logic element, wherein the logic element output of the first logic element is coupled to the logic element inputs of at least two other logic elements.

3. The method of claim 1, wherein the timing parameter is a maximum propagation delay, wherein the timing property is the determined propagation delay of an electrical signal transmitted through the identified path.

4. The method of claim 1, wherein the logic design includes a clock input applied with a clock signal, wherein the timing parameter is a maximum delay from an active edge of the clock signal to registration of an output signal, wherein the step of using the processor to determine a timing property includes the substep of using the processor to determine the delay from an active edge of the clock signal to registration of the output signal transmitted through the identified path.

5. The method of claim 1, wherein the logic design includes a clock input for receiving a clock signal, wherein the timing parameter is a minimum amount of time that a signal must be stable on an input before an active clock edge is received on the clock input, wherein the step of using the processor to determine a timing property includes the substep of using the processor to determine, for the identified path, the amount of time that a signal must be stable at the input before an active clock edge is received.

6. The method of claim 1, wherein the logic design includes a clock input for receiving a clock signal, wherein the identified path includes a logic element with a predetermined setup/hold time, wherein the timing parameter is a maximum period for the clock signal, wherein the step of using the processor to determine a timing property includes the substep of using the processor to determine, whether the maximum period for the clock exceeds the predetermined setup/hold time.

7. The method of claim 1, further comprising the steps of:

accepting additional signals from the user input device to define an additional timing parameter at a second node, wherein the second node is on the identified path;

using the processor to determine which of the first and second nodes is closest to the output of the identified path; and using the timing parameter corresponding to the node closest to the output of the identified path in steps (d) and (e).

8. The method of claim 1, further comprising the steps of:

accepting additional signals from the user input device to define a timing cut-off;

assigning the timing cut-off to a second node; and discarding paths that pass through the second node from the processing of steps (c), (d), and (e).

9. An apparatus for processing timing specifications in a logic design, the apparatus comprising:

a computer system coupled to a user input device, an output device and a processor;

a logic design description included within the computer system, wherein the logic design description includes logic design inputs, logic design outputs and a plurality of logic elements wherein a logic element includes at least one logic element input and at least one logic element output for coupling to other logic elements, the logic design inputs and the logic design outputs, wherein each logic element, logic element input, logic element output, logic design input and logic design output comprises a node, wherein one or more nodes exist on the paths;

defining means for accepting signals from the user input device by a user to define a timing specification, comprising a timing parameter associated with a first node in a path;

identification means coupled to the processor for identifying a path that originates at a logic design input, passes through the first node, and terminates at a logic design output;

determining means coupled to the processor for determining a timing property of an electrical signal transmitted through the identified path, wherein the timing property is associated with the timing specification;

comparing means coupled to the processor for comparing the timing property of the identified path with the timing specification; and indicating means coupled to the processor and the output device for outputting the relationship between the identified path's timing property and the timing specification.

* * * * *